United States Patent [19]
Dorweiler et al.

[11] Patent Number: 6,075,385
[45] Date of Patent: Jun. 13, 2000

[54] INTELLIGENT PRECHARGER FOR A DYNAMIC BUS

[75] Inventors: Paul J. Dorweiler; Thomas L. Meneghini, both of Fort Collins, Colo.

[73] Assignee: Hewlett-Packard Company, Palo Alto, Calif.

[21] Appl. No.: 09/167,079

[22] Filed: Oct. 6, 1998

[51] Int. Cl.[7] ..................................................... H03K 19/00
[52] U.S. Cl. .................................. 326/93; 326/95; 326/96
[58] Field of Search .................................. 396/93, 95, 96, 396/97, 98, 30, 86

[56] References Cited

U.S. PATENT DOCUMENTS 5,116,561  5/1992  Okura ........................................ 307/549

Primary Examiner—Michael Tokar
Assistant Examiner—Anh Tran

[57] ABSTRACT

A method and apparatus for precharging a dynamic bus on either phase of a clock signal is presented. An intelligent precharger in accordance with the invention monitors a dynamic bus and detects and signals a discharge event on the bus during a current phase of a clock signal. The current phase of the clock signal can be either one of a first phase or second phase of the clock signal. On the subsequent phase of the clock signal, which is the other of the first phase or second phase of the clock signal, the bus is then precharged.

9 Claims, 6 Drawing Sheets

INTELLIGENT PRECHARGER FOR A DYNAMIC BUS

FIELD OF THE INVENTION

The present invention pertains generally to dynamic logic circuits, and more particularly to an intelligent precharger for a dynamic bus.

BACKGROUND OF THE INVENTION

The semiconductor industry continues to yield integrated circuits (ICs) of increasing density in order to reduce their overall required chip space. At the same time, logic circuits continue to increase in speed, via a combination of higher component switching and pipelining techniques that increase the data throughput.

Integrated circuits are commonly implemented using dynamic logic. In dynamic logic, logic components are clocked by a clock signal, and communicate (i.e., transfer data) via dynamic busses. A standard dynamic bus normally operates in accordance with a clock signal CK, illustrated in FIG. 1. Clock signal CK has two timing phases—an evaluate phase CK1 and a precharge phase CK2. Components connected to the bus are precharged during precharge phase CK2 and evaluate during evaluate phase CK1. This type of bus is known generally as a single-phase dynamic bus. As the name implies, single-phase dynamic busses require that all components connected to the bus precharge and evaluate during identical phases. Accordingly, the actual bandwidth of the bus in relation to the overall bandwidth is reduced in proportion to the portion (typically 50%) of the duty cycle attributable to the precharge phase.

Recently, a bi-phase, single-bit dynamic bus implemented using a single wire has been developed, and is described in co-pending U.S. patent application Ser. No. 09/167,032, entitled "A Bi-Phase Single-Wire Dynamic Bus" to Meneghini et al., which is incorporated herein by reference. In accordance with the bi-phase single-wire dynamic bus, precharging and evaluation may occur on either phase of the clock signal. Precharging of the bus always occurs during the immediately subsequent clock phase of those clock phases during which the bus gets discharged. Thus, the precharger required for the bi-phase single-wire dynamic bus cannot rely simply on the current phase of the clock signal to determine whether or not to precharge the bus. Instead, the precharger must have some intelligence to know when the bus was discharged and to precharge the bus on the subsequent phase.

Accordingly, a need exists for an autonomous intelligent precharger circuit that monitors a dynamic bus, detects a discharge event on the bus, and automatically precharges the bus on the subsequent clock phase.

SUMMARY OF THE INVENTION

An intelligent precharger circuit is presented that constantly monitors a bi-phase, single-wire dynamic bus and autonomously precharges the bus on the subsequent clock phase whenever the voltage level on the bus drops below a predetermined threshold. In accordance with the invention, a discharge event capture circuit is coupled to a dynamic bus. The discharge event capture circuit monitors the bus and signals a discharge event when it detects a discharge of the bus below a threshold voltage level. The discharge event capture circuit comprises a pair of latches, one each that captures a discharge event during alternating clock phases. The intelligent precharger includes a precharger circuit that is responsive to a discharge event captured by either of the two latches of the discharge event capture circuit to precharge the bus on the subsequent phase of the clock signal during which the discharge even was detected.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel intelligent precharger that monitors a bi-phase single-wire dynamic bus and autonomously precharges the bus on the subsequent clock phase whenever the voltage level on the bus drops below a predetermined threshold is described in detail hereinafter. Although the invention is described in terms of operation with a bi-phase, single-wire dynamic bus, the intelligent precharger of the invention may be used to precharge conventional dynamic busses, and in other applications as well, and the illustrative embodiment presented herein is presented by way of example only and not limitation.

Figure 1:
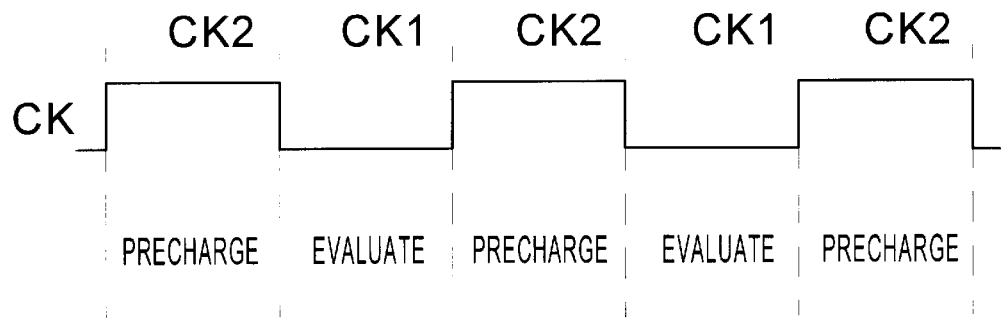
FIG. 1 is a timing diagram illustrating the dual phases of a clock signal in accordance with the operation of a single-phase dynamic bus.
Figure 2:
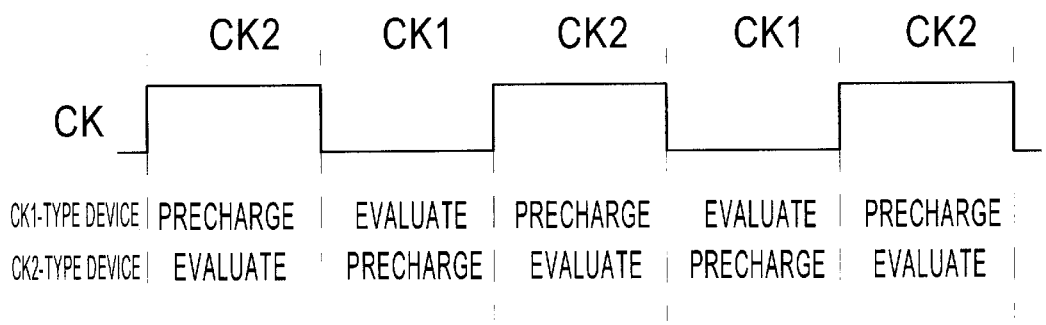
FIG. 2 is a timing diagram illustrating the dual phases of a clock signal in accordance with the operation of a bi-phase dynamic bus.

FIG. 2 is a timing diagram illustrating the alternating clock phases of different devices on a bi-phase dynamic bus. As described previously, a bi-phase dynamic bus allows devices, namely CK1-type devices and CK2-type devices, that talk to the bus on different respective clock phases CK1 or CK2, to share the bus. As shown in FIG. 2, CK1-type components connected to the bus precharge during precharge phase CK2 and evaluate during evaluate phase CK1. Similarly, CK2-type components connected to the bus precharge during precharge phase CK1 and evaluate during evaluate phase CK2.

Figure 3:
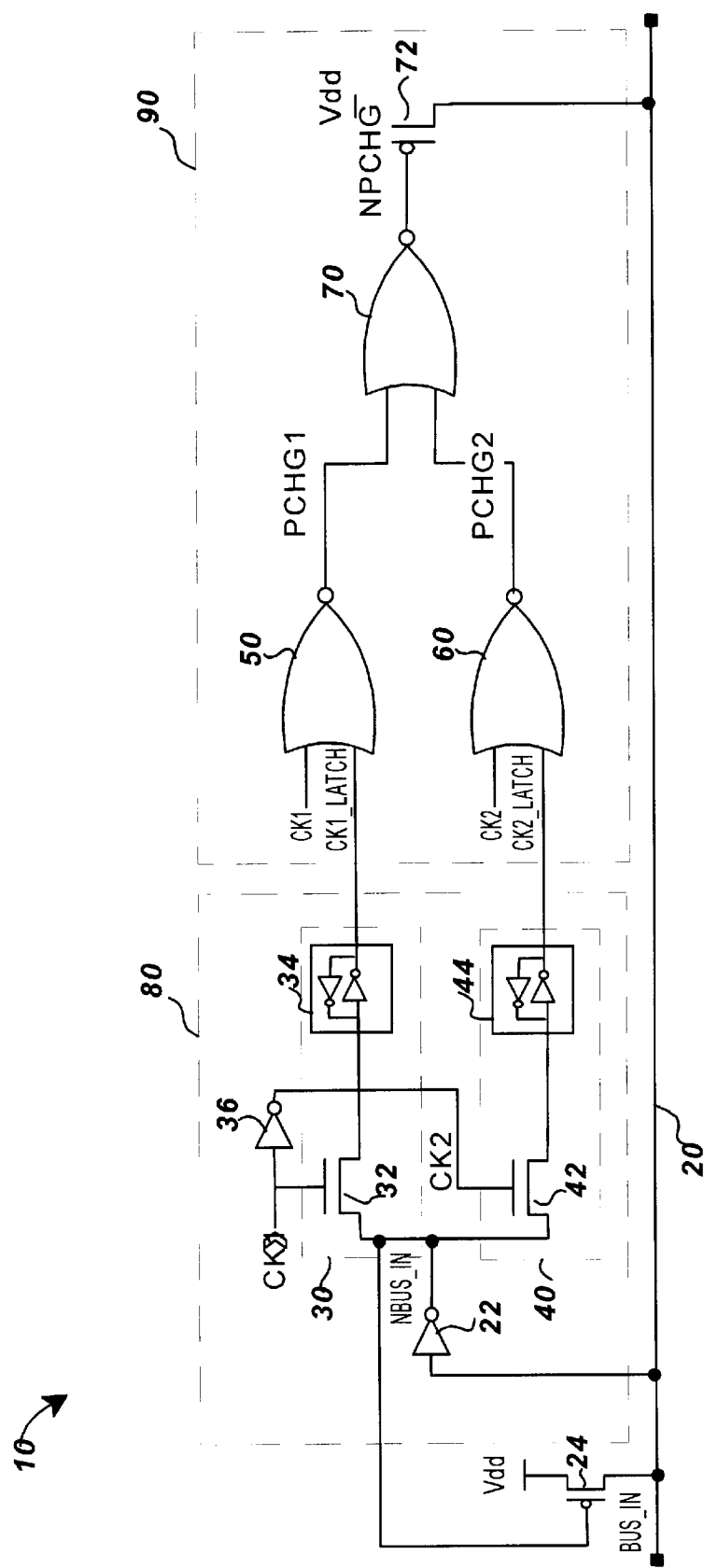
FIG. 3 is a schematic block diagram of an intelligent precharger circuit in accordance with one embodiment of the invention.

FIG. 3 is a schematic diagram of an intelligent precharger circuit, shown at 10, in accordance with a first embodiment of the invention. Precharger circuit 10 includes a discharge event capture circuit 80 which monitors a bus 20 to capture a discharge event on each phase CK1, CK2 of a clock signal CK, followed by a precharger circuit 90, which operates to precharge bus 20 on the subsequent phase of the clock whenever the discharge event capture circuit 80 detects a discharge event. In the illustrative embodiment, discharge event capture circuit 80 includes CK1 phase latch 30 and CK2 phase latch 40. CK1 latch 30 monitors bi-phase, single-wire dynamic bus 20 during the CK1 phase of clock signal CK and the CK2 latch 40 monitors bus 20 during the CK2 phase of clock signal CK. In the event that the bus discharges, one of latch 30 or 40 captures the event and holds it through to the subsequent phase.

In the particular implementation of the intelligent precharger 10 of the invention, both latches 30 and 40 are coupled to receive an inverted version NBUS_IN of the signal BUS_IN on bus 20. The inverted signal NBUS_IN is generated by inverting bus signal BUS_IN with inverter 22 that is coupled between bus 20 and each of the inputs of latches 30 and 40. Methods for generating clock signals are known in the art. In the illustrative embodiment, CK2 is 180° out-of-phase with CK1. Latch 30 is clocked by CK1 and latch 40 is clocked by CK2. Accordingly, during any given clock phase, one or the other of latches 30 and 40 is connected to bus 20.

Latch 30 comprises a transfer gate 32 and a sample/hold (S/H) circuit 34. In the first embodiment, transfer gate 32 is implemented with an n-type field effect transistor (NFET) that is coupled source-to-drain between the output of inverter 22 and the input to S/H circuit 34. The gate of NFET transfer gate 32 is coupled to signal CK1. Accordingly, during a CK1 phase, the inverted bus signal NBUS_IN is captured by S/H circuit 34; during a CK2 phase, transfer gate 32 is closed, thereby isolating the value held in the latch 30 from changes in bus signal BUS_IN.

Latch 40 comprises a transfer gate 42 and a sample/hold (S/H) circuit 44. In the first embodiment, transfer gate 42 is implemented with an NFET coupled source-to-drain between the output of inverter 22 and the input to S/H circuit 44. The gate of NFET transfer gate 42 is coupled to signal CK2. Accordingly, during a CK2 phase, the inverted bus signal NBUS_IN is captured by S/H circuit 34; during a CK1 phase, transfer gate 42 is closed, thereby isolating the value held in the latch 40 from changes in bus signal BUS_IN.

The configuration of CK1 latch 30 and CK2 latch 40 coupled to bus 20 operates to constantly monitor bus 20, capture a discharge event on bus 20, and act as a bus history for input to precharger circuit 90, implemented in the illustrative embodiment in FIG. 3 by NOR gates 50, 60 and 70, which determines whether to precharge the bus 20 on the next clock phase, and precharge FET device 72. In the first embodiment, the amount of discharge on bus 20 that triggers an event may be set by adjusting the discharge threshold via the trigger point of inverter 22.

The precharger circuit 90, including logical NOR gates 50 and 60 feeding in parallel to NOR gate 70, serves as the intelligence of the precharger. The precharger precharges bus 20 only if the bus was discharged on the previous clock phase. NOR gate 50 receives signal CK1 and the bus value CK1_LATCH captured during the CK1 phase and held on output of S/H circuit 34. NOR gate 50 outputs a logical high only if both inputs CK1 and CK1_LATCH are logically low, meaning that the bus was discharged during the CK1 phase immediately before the current CK2 phase. NOR gate 60 is similarly structured, in that it receives signal CK2 and the bus value CK2_LATCH captured during the CK2 phase and held on output of S/H circuit 44. NOR gate 60 outputs a logical high only if both inputs are logically low, meaning that the bus was discharged during the CK2 phase immediately before the current CK1 phase.

The outputs of both NOR gates 50 and 60 are then logically NOR'ed by NOR gate 70. Precharge device 72, preferably implemented using a pull-up p-type field effect transistor (PFET), is coupled between a power source Vdd and the bus 20. The gate of PFET 72 is controlled by the output of NOR gate 70, and accordingly, PFET 72 operates to pull up, or precharge, bus 20 to Vdd on the current clock phase whenever the output of NOR gate 70 is logically low. A logical high output on either gate 50 or 60 or on both causes the output of NOR gate 70 to be logically low. Thus, it will be appreciated that the intelligent precharger 10 of the invention is autonomous in that if bus 20 is discharged in the previous phase, regardless of whether the previous phase was a CK1 phase or a CK2 phase, it will precharge in the immediately subsequent phase.

Figure 4:
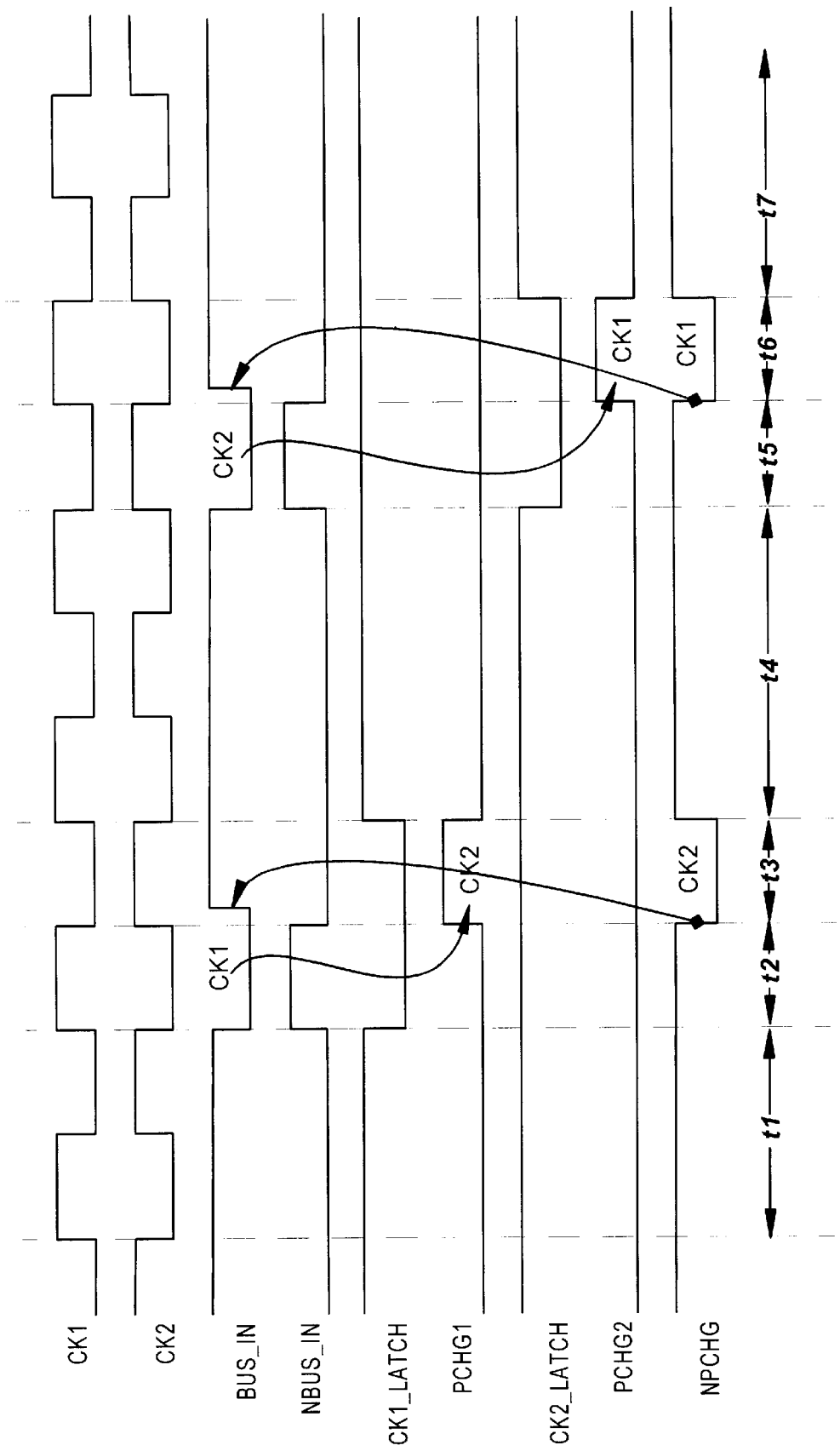
FIG. 4 is a timing diagram illustrating the operation of the precharger circuit of FIG. 3.

FIG. 4 is a timing diagram illustrating the operation of the precharger in response to bus input signal BUS_IN. In this illustration, bus signal BUS_IN is discharged first during a CK1 phase, and then subsequently during a CK2 phase. During time t1, BUS_IN is logically high. Thus, no discharge event is captured in either CK1 phase latch 30 or CK2 phase latch 40, as reflected by the logically low value of CK1_LATCH and CK2_LATCH signals during this period.

During time t2, while in the CK1 phase (as reflected by signal CK1 being logically high), bus signal BUS_IN discharges. As a result, inverted bus signal NBUS_IN goes high. Inverted bus signal NBUS_IN is inverted again by and held in latch 30 as CK1_LATCH signal. CK1_LATCH signal is output as received during CK1 phase during time t2, and held during CK2 phase in time t3. Consequently, the output signal PCHG1 of NOR gate 50 is triggered high only upon the falling edge of CK1 at the beginning of time t3. PCHG1 remains high until the next rising edge of CK1 or the rising edge of CK1_LATCH, whichever occurs sooner. Bus signal BUS_IN returns high at the beginning of time t3. This causes inverted bus signal NBUS_IN to fall low, which is then inverted and latched by latch 30 during the next CK1 phase in time t4, causing signal CK1_LATCH to go high. Because PCHG1 is high during time t3, this causes signal NPCHG at the output of NOR gate 70 to go low, which in turn turns on PFET 72 to precharge bus 20. Thus, a discharge on bus 20 during a CK1 phase (see time period t2) results in a precharge of bus 20 during the subsequent CK2 phase (see time period t3).

Because bus signal BUS_IN remains high during all of time period t4, latches 30 and 40 do not capture a discharge event, and consequently signal NPCHG output from NOR gate 70 remains high during the entire period.

In time period t5, which is a CK2 phase, bus signal BUS_IN discharges. Latch 60 captures the event during time period t5 and holds it as output signal CK2_LATCH during period t6. Output signal PCHG2 of NOR gate 60 is triggered high only upon the falling edge of CK2 at the beginning of time t6. PCHG2 remains high until the next rising edge of CK2 or the rising edge of CK2_LATCH, whichever occurs sooner. Bus signal BUS_IN returns high at the beginning of time t7. This causes inverted bus signal NBUS_IN to fall low, which is then inverted and latched by latch 40 during the next CK2 phase in time t7, causing signal CK2_LATCH to go high. Because PCHG2 is high during time t6, this causes signal NPCHG at the output of NOR gate 70 to go low, which in turn turns on PFET 72 to precharge bus 20. Thus, as illustrated, a discharge on bus 20 during a CK2 phase (see time period t5) results in a precharge of bus 20 during the subsequent CK1 phase (see time period t6).

Figure 5:
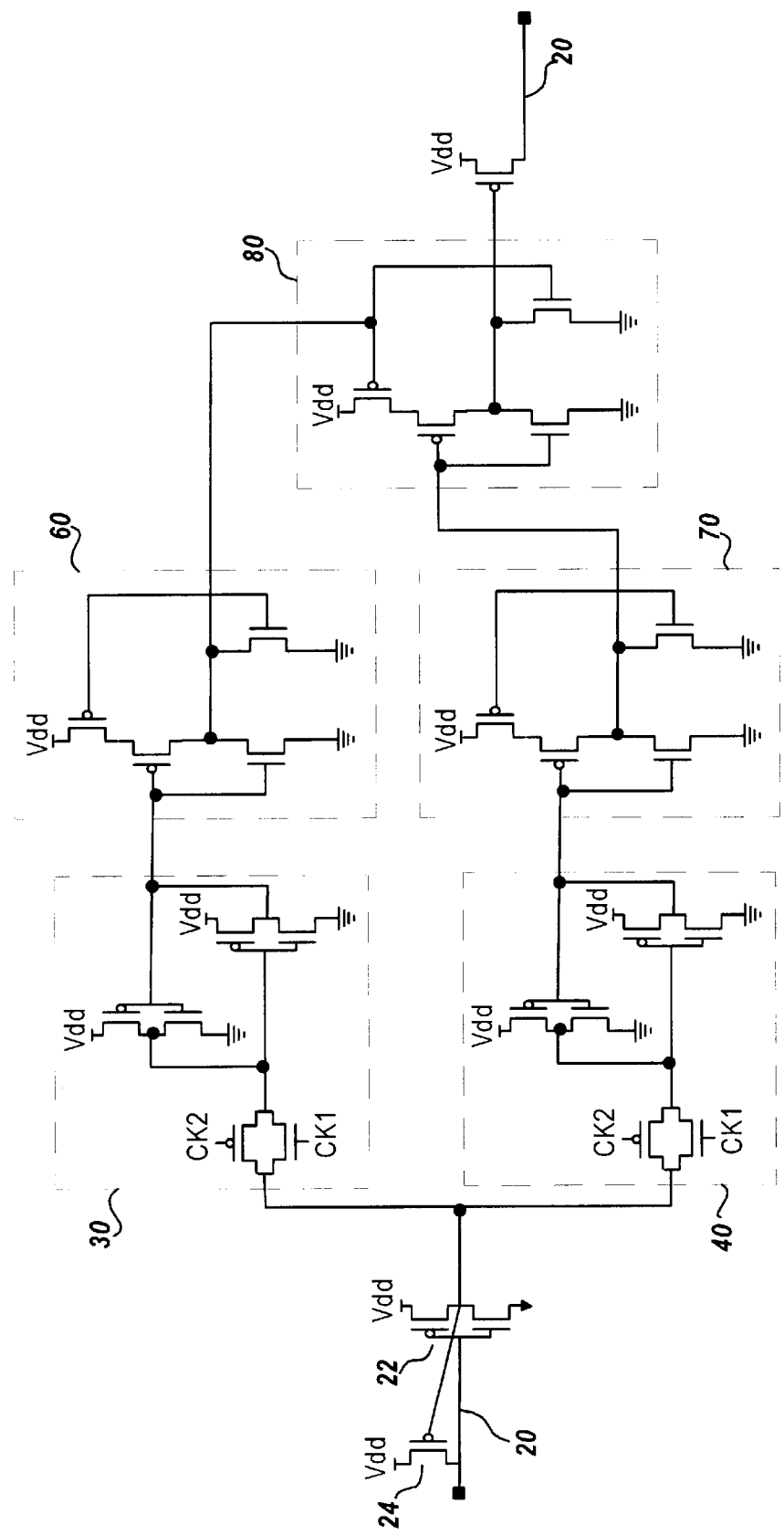
FIG. 5 is a schematic diagram of one implementation of the intelligent precharger circuit of FIG. 3.

FIG. 5 is a schematic diagram of one implementation in accordance with the intelligent precharger of the invention. Note that in this implementation a PFET 24 coupled between the bus 20 and output of inverter 22 operates as a bus holder device. This implementation avoids a possible drive fight start-up condition. Since holder PFET 24 is driven by the same inverter 22 which drives the latches 30 and 40, the implementation in FIG. 5 will always resolve the state of the bus 20. Either holder PFET 24 is on, in which case bus 20 will precharge high, or holder PFET 24 is off, in which case one of the latches will fire and turn on the precharger in the subsequent phase.

Figure 6:
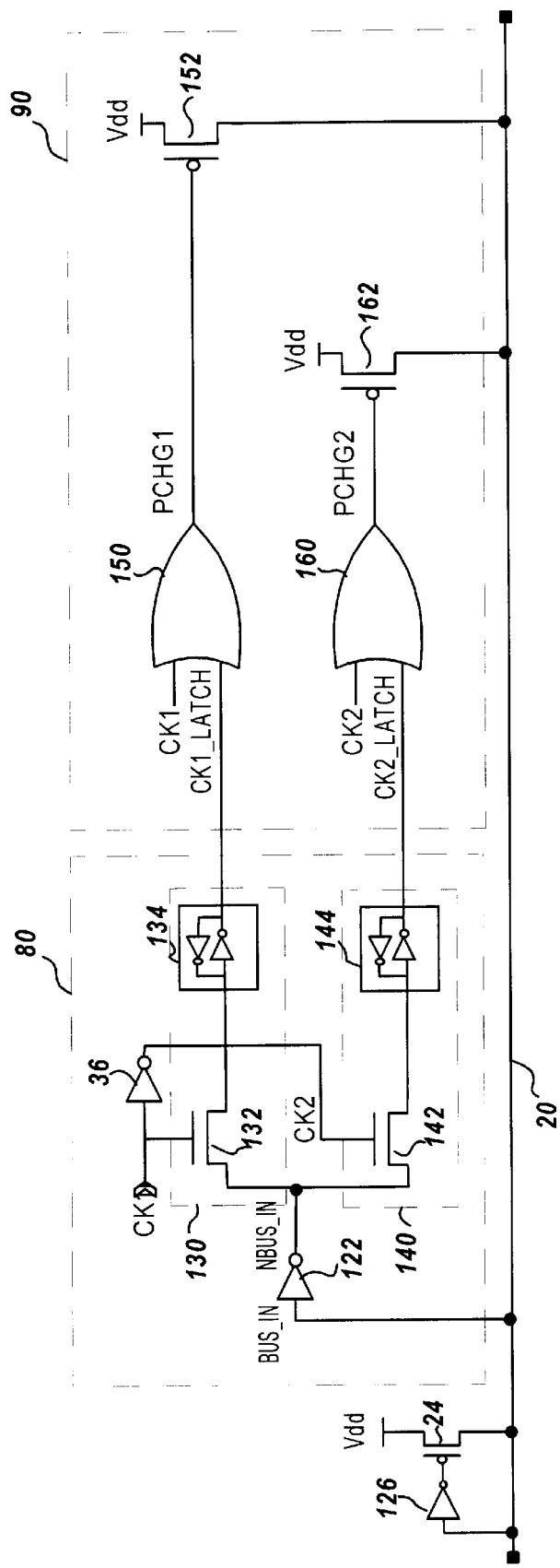
FIG. 6 is a schematic block diagram illustrating an alternative embodiment of the invention.
Figure 7:
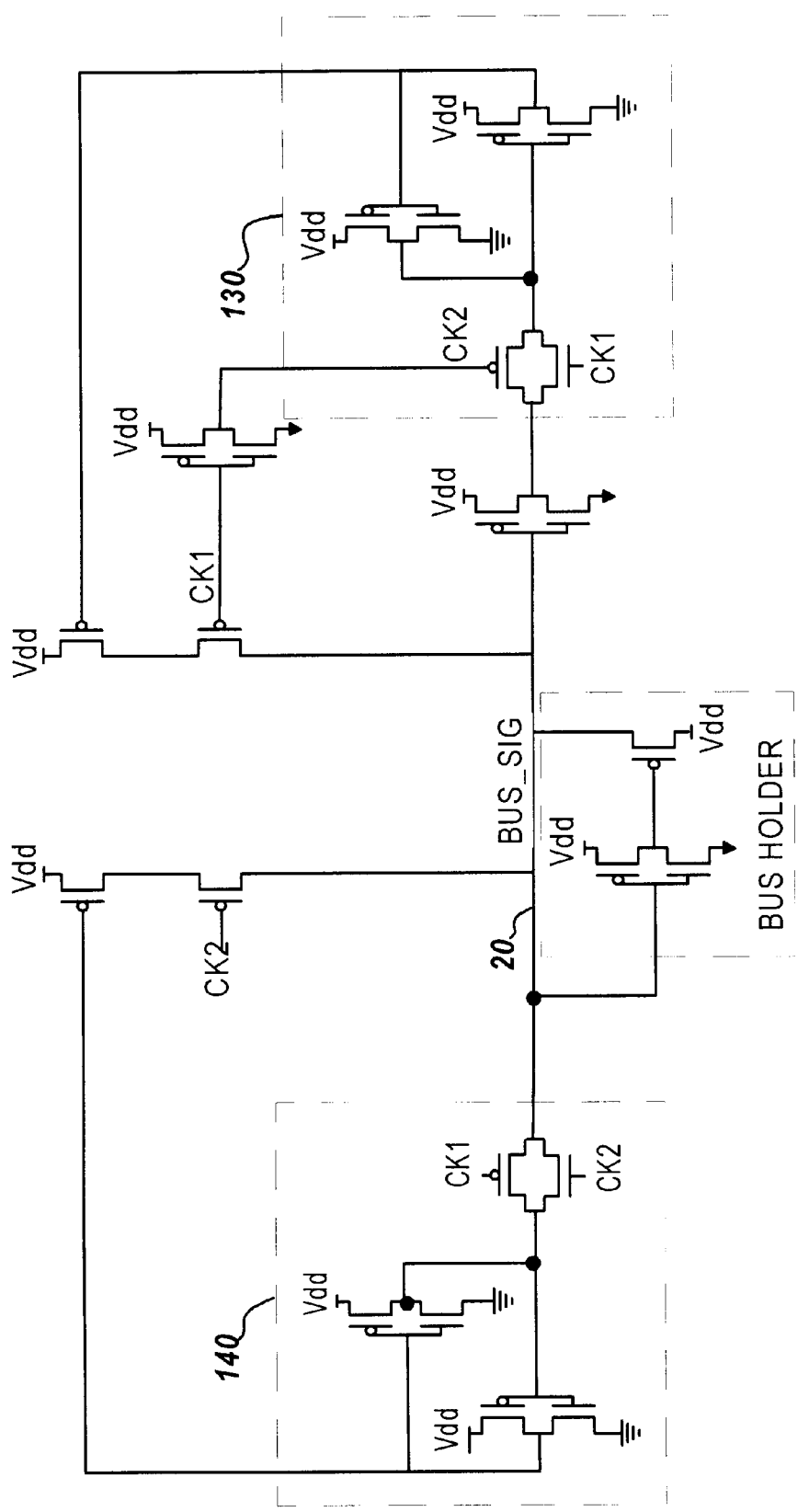
FIG. 7 is a schematic diagram of one implementation of the intelligent precharger circuit of FIG. 6.

FIG. 6 is a schematic block diagram illustrating an alternative embodiment of the invention. FIG. 7 is a schematic diagram of one implementation in accordance with the embodiment shown in FIG. 6. In this implementation, CK1 and CK1_LATCH feed into OR gate 150 which drives PFET 152, which is coupled between power source Vdd and bus 20. Similarly, CK2 and CK2_LATCH feed into OR gate 160 which drives PFET 162, which is coupled between power source Vdd and bus 20. The implementation of FIG. 7 avoids the additional FETS required when implementing NOR gate 70 in the embodiment of FIG. 5. In addition, inverter 122 drives latches 130, 140, while a separate inverter 126 drives holder PFET 24.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. An intelligent precharger for a dynamic bus, comprising:
    a discharge event capture circuit coupled to monitor said dynamic bus which detects a discharge event on said bus during a current phase of a clock signal, said current phase of said clock signal being one of either a first phase or second phase of said clock signal; and
    a precharger circuit responsive to said detection of said discharge event which precharges said bus on a subsequent phase of said clock signal when said discharge event is detected, said subsequent phase being the other of said first phase or second phase of said clock signal.

2. A precharger in accordance with claim 1, wherein:
said discharge event capture circuit comprises:
    a first latch coupled to said bus which generates a first capture signal if said discharge event occurs during said first phase of said clock signal; and
    a second latch coupled to said bus which generates a second capture signal if said discharge event occurs during said second phase of said dock signal.

3. A precharger in accordance with claim 2, wherein:
said precharger circuit is responsive to said first capture signal to precharge said bus during said subsequent second phase of said clock signal, and is responsive to said second capture signal to precharge said bus during said subsequent first phase of said clock signal.

4. A precharger in accordance with claim 3, wherein:
said precharger circuit comprises:
    a combinatorial logic function coupled to receive said first capture signal, said second capture signal, a first clock phase signal, and a second clock phase signal, said first clock phase signal representing said first phase of said clock signal and said second clock phase signal representing said second phase of said clock signal, to generate a precharge signal during said second clock phase signal immediately after receiving said first capture signal and during said first clock phase signal immediately after receiving said second capture signal; and
    a precharger device responsive to said precharge signal to precharge said bus.

5. An intelligent precharger in accordance with claim 1, comprising:
a bus holder circuit comprising:
    an inverter comprising an input coupled to said bus and an output; and
    a field effect transistor (FET) comprising a source coupled to a power source, a drain coupled to said bus, and a gate coupled to said inverter output.

6. An intelligent precharger in accordance with claim 2, comprising:
a bus holder circuit comprising:
    an inverter comprising an input coupled to said bus and an output; and
    a field effect transistor (FET) comprising a source coupled to a power source, a drain coupled to said bus, and a gate coupled to said inverter output.

7. An intelligent precharger in accordance with claim 6, wherein:
said inverter output is coupled to said first latch and said second latch.

8. An intelligent precharger in accordance with claim 6, comprising:
a second inverter comprising an input coupled to said bus and an output coupled to said first latch and said second latch.

9. A method for precharging a dynamic bus on either phase of a clock signal, said clock signal comprising a first phase and a second phase, comprising:
    detecting a discharge event on said bus during a current phase of a clock signal, said current phase of said clock signal being either one of a first phase or second phase of said clock signal; and
    precharging said bus on a subsequent phase of said clock signal when said discharge event is detected, said subsequent phase being the other of said either one of said first phase or second phase of said clock signal.

* * * * *

UNITED STATES PATENT AND TRADEMARK OFFICE
CERTIFICATE OF CORRECTION

PATENT NO.    : 6,075,385
DATED         : June 13, 2000
INVENTOR(S)   : Paul J. Dorweiler et al.

It is certified that error appears in the above-identified patent and that said Letters Patent is hereby corrected as shown below:

Column 2,
Line 4, delete "even was" and insert therefor -- event was --

Column 5,
Line 49, delete "dock" and insert therefor -- clock --

Signed and Sealed this

Fourth Day of June, 2002

*Attest:*

*Attesting Officer*

JAMES E. ROGAN
*Director of the United States Patent and Trademark Office*